US005699213A

United States Patent [19]
Ohyama et al.

[11] Patent Number: 5,699,213
[45] Date of Patent: Dec. 16, 1997

[54] MAGNETORESISTIVE HEAD HAVING A MAGNETIC DOMAIN CONTROL LAYER

[75] Inventors: Tatsushi Ohyama; Naoto Matono, both of Kadoma, Japan

[73] Assignee: Sanyo Electric Co., Ltd., Osaka, Japan

[21] Appl. No.: 638,871

[22] Filed: Apr. 29, 1996

Related U.S. Application Data

[63] Continuation of Ser. No. 340,395, Nov. 15, 1994.

[30] Foreign Application Priority Data

Nov. 16, 1993 [JP] Japan ................................ 5-286651
Nov. 29, 1993 [JP] Japan ................................ 5-298327

[51] Int. Cl.$^6$ ........................ G11B 5/127; G11B 5/33; G01R 33/02
[52] U.S. Cl. ........................ 360/113; 324/252
[58] Field of Search ........................ 360/113; 324/252; 338/32 R

[56] References Cited

U.S. PATENT DOCUMENTS

| | | | |
|---|---|---|---|
| 4,663,685 | 5/1987 | Tsang | 360/113 |
| 4,825,325 | 4/1989 | Howard | 360/113 |
| 5,005,096 | 4/1991 | Krounbi et al. | 360/113 |
| 5,159,513 | 10/1992 | Dieny et al. | 360/113 |
| 5,301,079 | 4/1994 | Cain et al. | 360/113 |
| 5,315,468 | 5/1994 | Lin et al. | 360/113 |
| 5,327,313 | 7/1994 | Nishioka et al. | 360/113 |
| 5,365,212 | 11/1994 | Saito et al. | 338/32 R |
| 5,581,427 | 12/1996 | Feng et al. | 360/113 |

*Primary Examiner*—Robert S. Tupper
*Assistant Examiner*—Adriana Giordana
*Attorney, Agent, or Firm*—Nikaido Marmelstein Murray & Oram LLP

[57] ABSTRACT

A magnetoresistive head includes a magnetoresistive film and a magnetic domain control layer, formed by a paramagnetic film which is provided in contact with the magnetoresistive film and an antiferromagnetic film which is provided in contact with the paramagnetic film, provided in contact with the magnetoresistive film.

17 Claims, 8 Drawing Sheets

MAGNETORESISTIVE HEAD HAVING A MAGNETIC DOMAIN CONTROL LAYER

This application is a continuation of application Ser. No. 08/340,395 Filed Nov. 15, 1994.

BACKGROUND OF THE INVENTION

1. Field of the Invention

The present invention relates to a magnetoresistive head for converting a magnetic signal to an electric signal by a magnetoresistive effect, and more particularly, it relates to a magnetoresistive head which is applicable to a miniature magnetic recorder having high sensitivity such as a magnetic disk unit.

2. Description of the Background Art

As to a magnetoresistive head having a high output, study is made on application to a reproducing head of a magnetic disk unit or the like. In the magnetoresistive head, however, Barkhausen noise is caused by movement of magnetic domain walls in a magnetoresistive film. In order to solve this problem, Japanese Patent Publication No. 60-32330 (1985) discloses a method of forming an antiferromagnetic film on a magnetoresistive film. In this method, however, exchange coupling is disadvantageously increased to reduce reproduction sensitivity, although the Barkhausen noise is reduced.

In order to solve this problem, Japanese Patent Laying-Open No. 5-135331 (1993) discloses a structure of providing a ferromagnetic film for controlling exchange coupling between the magnetoresistive film and the antiferromagnetic film. According to this method, it is possible to control exchange coupling magnetic field to not more than 10 Oe, thereby suppressing reduction of reproduction sensitivity.

In this method, however, it is necessary to provide the ferromagnetic film for controlling exchange coupling in a thickness of about 50 to 500 Å, as described in the above gazette. Thus, the distance between upper and lower shielding layers, i.e., the gap length, is so increased that high densification cannot be attained.

In the above gazette, further, an alloy film which is prepared by adding Nb to an NiFe alloy film is employed as the ferromagnetic film for controlling exchange coupling. In this case, it is necessary to increase Nb concentration in order to reduce strength of an exchange coupling magnetic field as well as to reduce the thickness of the ferromagnetic film for controlling exchange coupling. When the Nb concentration is increased, however, the crystal structure of the (NiFe)Nb film is so disturbed that stable exchange coupling cannot be obtained due to such disturbance of the crystal structure.

SUMMARY OF THE INVENTION

An object of the present invention is to provide a novel structure of a magnetoresistive head which can stably control exchange coupling at a small level without increasing its gap length.

The magnetoresistive head according to the present invention comprises a magnetoresistive film for converting a magnetic signal to an electric signal by a magnetoresistive effect, a first magnetic domain control layer which is provided in contact with the magnetoresistive film, and a pair of electrodes for feeding a signal detection current to the magnetoresistive film. The feature of the present invention resides in that the first magnetic domain control layer has a paramagnetic film which is provided in contact with the magnetoresistive film, and an antiferromagnetic film which is provided in contact with the paramagnetic film.

The magnetoresistive film employed in the present invention can be formed by that which is generally employed for a magnetoresistive head, such as a ferromagnetic film of an alloy mainly composed of Fe, Co and Ni, for example. This film may have a multilayer film structure obtained by stacking such alloy films.

The material for the antiferromagnetic film forming the first magnetic domain control layer in the present invention is not particularly restricted so far as the same exhibits excellent magnetic exchange coupling with respect to the magnetoresistive film, and can be prepared from an FeMn alloy, a CrAl alloy, an NiMn alloy, an alloy prepared by adding a metal of a third component such as Pd, Pt, Ir or Er to the above alloys, or NiO for example.

The paramagnetic film forming the first magnetic domain control layer in the present invention is not particularly restricted so far as the same can reduce an exchange coupling magnetic field, while the same preferably has a crystal structure which is similar to those of the magnetoresistive film and the antiferromagnetic film forming the magnetic domain control layer. When the magnetoresistive film and the antiferromagnetic film are formed by an NiFe alloy film and a γ-FeMn film having fcc (face-center cubic) structures respectively, it is preferable that the paramagnetic film also has an fcc (face-center cubic) structure in response.

It is also preferable that the paramagnetic film has a lattice constant which is close to those of the magnetoresistive film and the antiferromagnetic film. The lattice constant of the paramagnetic film is preferably in the range of 100±20%, more preferably in the range of 100±10% compared with those of the magnetoresistive film and the antiferromagnetic film.

According to the present invention, the thickness of the paramagnetic film, which is properly selected in response to those of the magnetoresistive film and the antiferromagnetic film, is preferably not more than 50 Å, more preferably not more than 10 Å, when the magnetoresistive film and the antiferromagnetic film have thicknesses of 100 to 400 Å and 75 to 250 Å respectively.

According to the present invention, the first magnetic domain control layer has a two-layer structure consisting of the paramagnetic and antiferromagnetic films, so that the antiferromagnetic film is provided on the magnetoresistive film through the paramagnetic film. The paramagnetic film can control an exchange coupling magnetic field with a small thickness, whereby high densification of magnetic recording/reproduction can be attained without increasing the gap length of the magnetic head. Further, the paramagnetic film employed in the present invention can control the level of exchange coupling with no disturbance in crystal structure dissimilarly to the prior art, whereby it is possible to stably control the exchange coupling magnetic field.

According to the present invention, it is possible to obtain a magnetoresistive head having high reproduction sensitivity which can stably control exchange coupling at a small level with small Barkhausen noise, by employing the magnetic domain control layer formed by the paramagnetic film which is provided in contact with the magnetoresistive film and the antiferromagnetic film which is provided in contact with the paramagnetic film as a first magnetic domain control layer.

According to the present invention, it is possible to control the level of exchange coupling by the paramagnetic film having a small thickness, whereby the magnetoresistive head can be highly densified with no increase in gap length. Further, it is possible to control exchange coupling at a small level with smaller influence on magnetic properties as compared with the prior art, due to employment of the paramagnetic film.

In one of preferred modes according to the present invention, a second magnetic domain control layer is provided in a position separated from a side surface of the magnetoresistive film in a direction that the current from the pair of electrodes flows. Such a second magnetic domain control layer is magnetostatically connected with the magnetoresistive film, whereby a closure domain is formed in the second magnetic domain control layer. In the magnetoresistive film, therefore, a closure domain which is formed in its end portion disappears to provide a single magnetic domain structure, despite a small exchange coupling magnetic field between the magnetoresistive film and the antiferromagnetic film. Further, the magnetoresistive film, which is separated from the second magnetic domain control layer, is not influenced by the closure domain formed in the second magnetic domain control layer. Thus, it is possible to further suppress Barkhausen noise without deteriorating reproduction sensitivity.

The second magnetic domain control layer is preferably made of a material having a larger anisotropy magnetic field than the magnetoresistive film. Further, the second magnetic domain control layer is preferably formed by a soft magnetic film such as a film of a CoZr amorphous alloy or the like.

The distance between the magnetoresistive film and the second magnetic domain control layer is preferably not more than 4 μm.

A side surface of the second magnetic domain control layer is preferably formed to be opposed to the overall side surface of the magnetoresistive film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
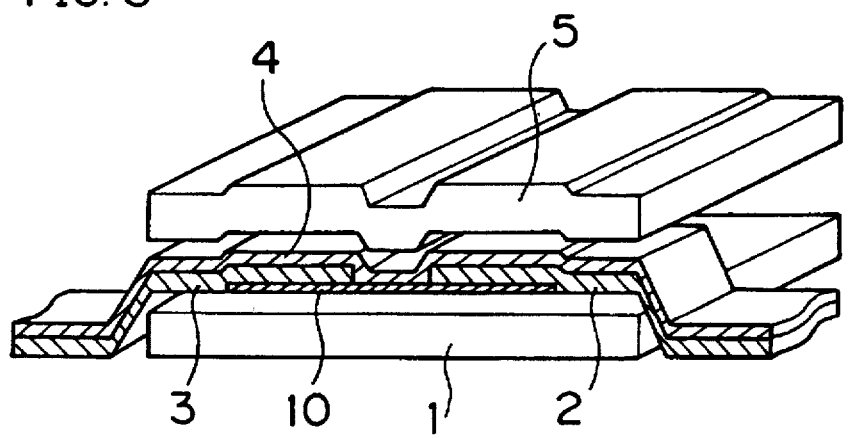
FIG. 3 is a perspective view showing a magnetoresistive head according to the first embodiment of the present invention.

FIG. 3 is a perspective view showing a magnetoresistive head according to a first embodiment of the present invention. Referring to FIG. 3, a lower shielding layer 1 consisting of an NiFe alloy, having a thickness of about 1 μm, is formed on an insulating layer (not shown) consisting of alumina, having a thickness of 10 μm, which is formed on a ceramic substrate of $Al_2O_3$—TiC or the like by sputtering. A lower insulating layer (not shown) consisting of alumina, having a thickness of 0.2 μm, is formed on the lower shielding layer 1, so that a magnetoresistive element part 10 consisting of a magnetoresistive film and a magnetic domain control layer is formed on this lower insulating layer. A pair of electrodes 2 and 3, each of which is formed by three layers of Mo, Au and Mo having thicknesses of 200 Å, 1000 Å and 200 Å respectively, are provided on the magnetoresistive element part 10 through a distance corresponding to a track width. A shunt film 4 consisting of Mo, having a thickness of 80 Å, is formed on the electrodes 2 and 3 and a portion of the magnetoresistive element part 10 located between the electrodes 2 and 3. An upper insulating layer (not shown) consisting of alumina, having a thickness of 0.15 μm, is formed on the shunt film 4, while an upper shielding layer 5 consisting of an NiFe alloy, having a thickness of about 1 μm, is formed on the upper insulating layer.

The lower and upper shielding layers 1 and 5, which are adapted to prevent the magnetoresistive element part 10 from influence of magnetic fields other than a signal magnetic field thereby improving signal resolution, can alternatively be prepared from a soft magnetic material such as a Co based amorphous alloy, in place of the aforementioned NiFe alloy.

The electrodes 2 and 3, which are adapted to feed a signal detection current to the magnetoresistive film of the magnetoresistive element part 10, are generally 1000 to 2000 Å in thickness.

The shunt film 4, which is adapted to apply a transverse bias magnetic field to the magnetoresistive element part 10, can alternatively be made of a metal such as Ti, Nb, Ta or W, in place of the aforementioned Mo. This shunt film 4 is generally 80 to 1000 Å in thickness.

Figure 1:
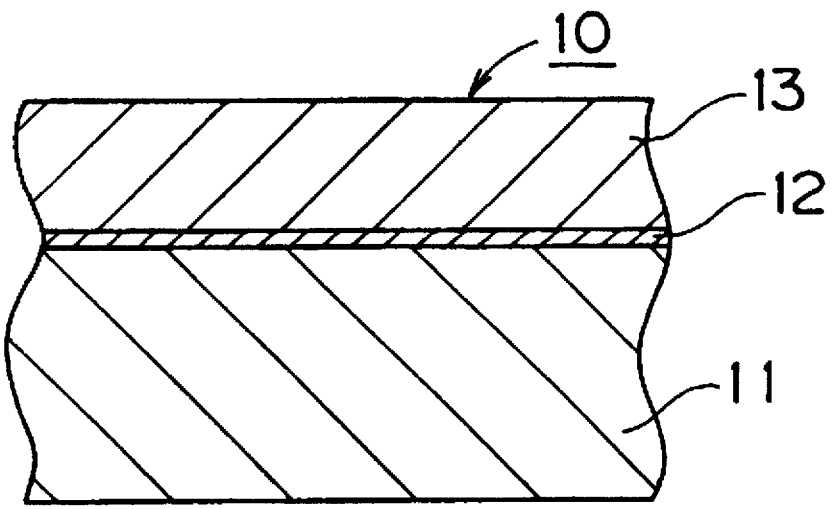
FIG. 1 is a sectional view showing a magnetoresistive element part according to a first embodiment of the present invention.

FIG. 1 is a sectional view of the magnetoresistive element part 10 shown in FIG. 3. Referring to FIG. 1, the magnetoresistive element part 10 is formed by stacking an antiferromagnetic film 13 on a magnetoresistive film 11 through a paramagnetic film 12. According to this embodiment, the magnetoresistive film 11 is prepared from an NiFe alloy in a thickness of 300 Å and the antiferromagnetic film 13 is prepared from a γ-FeMn alloy in a thickness of 150 Å, while the paramagnetic film 12 is prepared from an NiCu alloy in a thickness of 10 Å. This magnetoresistive element part 10 is patterned into 150 by 5 μm in size by etching.

The NiFe alloy forming the magnetoresistive film 11 has an fcc (face-center cubic) structure with a lattice constant of about 3.55 Å, and the γ-FeMn alloy forming the antiferromagnetic film 13 also has an fcc (face-center cubic) structure with a lattice constant of about 3.60 Å. On the other hand, the NiCu alloy forming the paramagnetic film 12 is a paramagnetic material having a Curie point of not more than 20° C in a composition range containing about 70 to 40 atomic percent of Ni. This NiCu alloy also has an fcc (face-center cubic) structure similarly to the magnetoresistive film 11 and the antiferromagnetic film 13 with a lattice constant of about 3.85 Å, which is extremely close to those of the magnetoresistive film 11 and the antiferromagnetic film 13.

Figure 7:
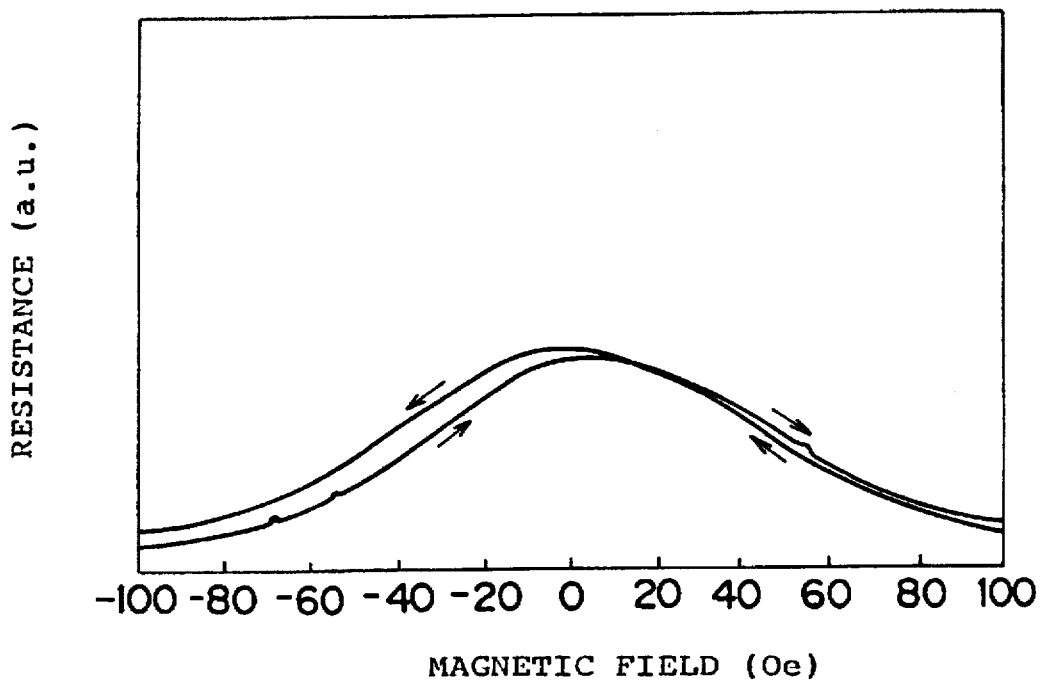
FIG. 7 illustrates resistance-magnetic field curves in the magnetoresistive head according to the first embodiment of the present invention.
Figure 8:
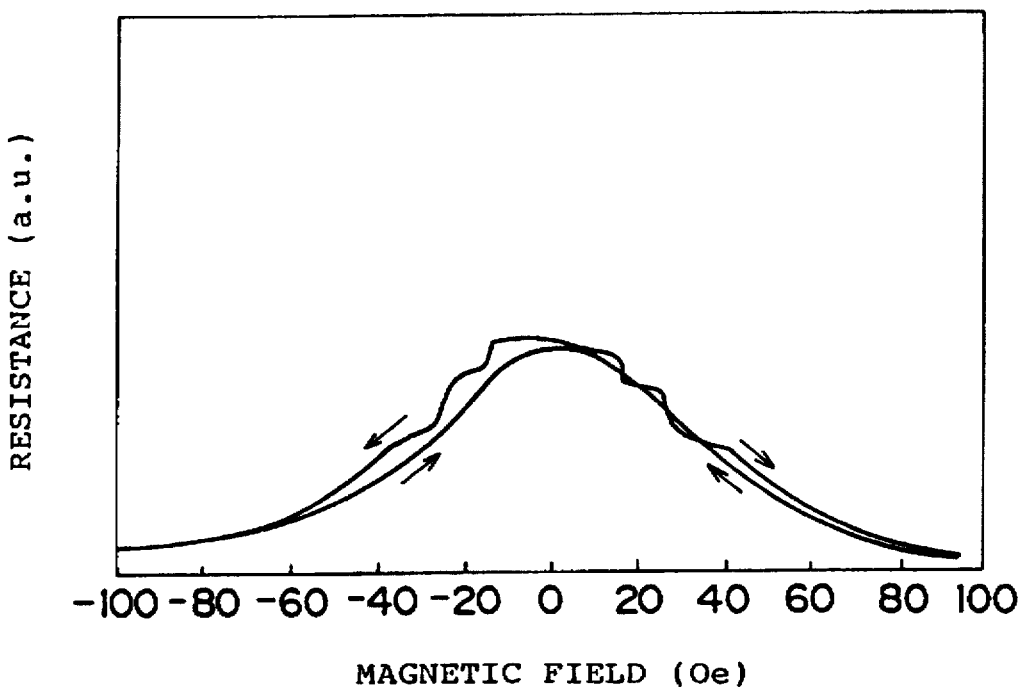
FIG. 8 illustrates resistance-magnetic field curves of a comparative magnetoresistive head.

FIG. 7 illustrates resistance-magnetic field curves as to a magnetic head provided having the magnetoresistive element part 10 of the structure shown in FIG. 1. FIG. 8 illustrates resistance-magnetic field curves of a comparative magnetic head which is formed similarly to the embodiment shown in FIG. 3, except that its magnetoresistive element part is formed by only a magnetoresistive film with no provision of paramagnetic and antiferromagnetic films. Comparing FIGS. 7 and 8, it is understood possible to control the magnetic domain of the magnetoresistive film 11 by providing the antiferromagnetic film 13 thereon through the paramagnetic film 12, thereby attaining excellent characteristics with no Barkhausen noise.

A sample of this embodiment exhibited an exchange coupling magnetic field of 4.0 Oe in its magnetoresistive element part. Another sample of this embodiment which was prepared by reducing the thickness of its paramagnetic film from 10 Å to 5 Å exhibited an exchange coupling magnetic field of 7.0 Oe in its magnetoresistive element part. On the other hand, a comparative sample which was prepared by directly forming an antiferromagnetic film on a magnetoresistive film with no provision of a paramagnetic film exhibited an exchange coupling magnetic field of 25.0 Oe. Table 1 shows these results.

TABLE 1

| | Thickness of Paramagnetic Film (Å) | Exchange Coupling Magnetic Field (Oe) |
|---|---|---|
| Inventive Sample | 10 | 4.0 |
| | 5 | 7.0 |
| Comparative Sample | 0 | 25.0 |

As clearly understood from the results shown in Table 1, it is possible to control an exchange coupling magnetic field at a small level by providing a paramagnetic film between a magnetoresistive film and an antiferromagnetic film according to the present invention. Thus, it is possible to remarkably improve reproduction sensitivity.

Figure 2:
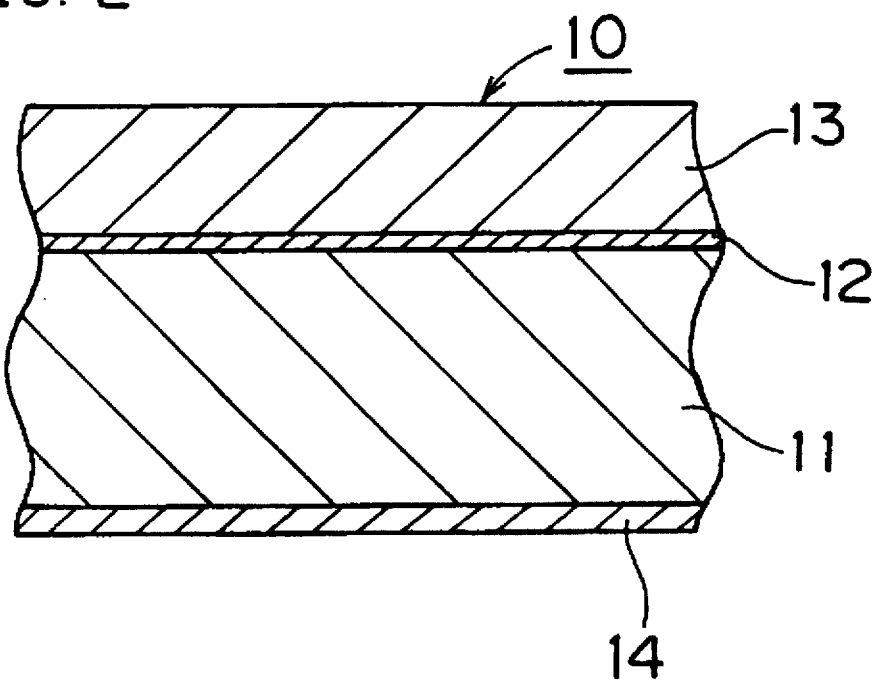
FIG. 2 is a sectional view showing a magnetoresistive element part according to a second embodiment of the present invention.

FIG. 2 is a sectional view showing a magnetoresistive element part 10 according to a second embodiment of the present invention. Referring to FIG. 2, a magnetoresistive film 11, a paramagnetic film 12 and an antiferromagnetic film 13 are successively formed on a substrate film 14, thereby forming a magnetoresistive element part 10. The substrate film 14 can be formed by a metal film which is mainly composed of Ta, Nb, Mo or Ti, or an $Si_3N_4$ insulating film, for example. It is possible to further stabilize the crystal structure of the magnetoresistive film 11 by forming the same on such a substrate film 14, thereby further stabilizing characteristics of an exchange coupling magnetic field.

Samples of this embodiment were prepared similarly to the above samples except that magnetoresistive element parts were formed on substrate films shown in FIG. 2, and subjected to measurement of exchange coupling magnetic fields. The substrate films were formed by Mo films of 30 Å in thickness and Ti films of 100 Å, while paramagnetic films were provided in thicknesses of 10 Å and 5 Å. Table 2 shows the results.

TABLE 2

| | Substrate Film (Thickness) | Thickness of Paramagnetic Film (Å) | Exchange Coupling Manetic Field (Oe) |
|---|---|---|---|
| Inventive Sample | Mo (30Å) | 10 | 4.5 |
| | | 5 | 8.0 |
| | Ti (100Å) | 10 | 4.5 |
| | | 5 | 8.0 |

From Table 2, it is understood possible to further stabilize characteristics of an exchange coupling magnetic field by forming a substrate film.

Figure 4:
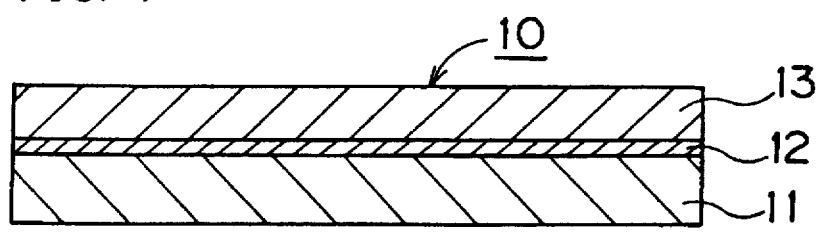
FIG. 4 is a sectional view showing an exemplary structure of the magnetoresistive element part employed in the present invention.
Figure 5:
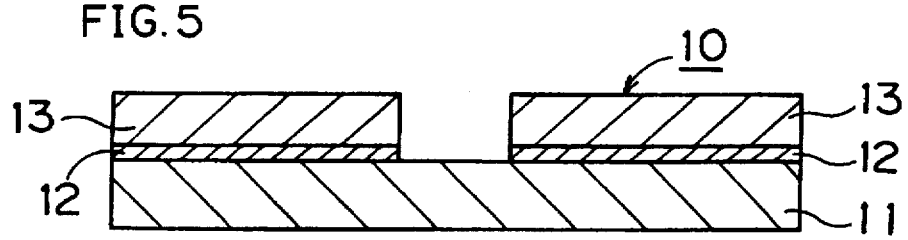
FIG. 5 is a sectional view showing another exemplary structure of the magnetoresistive element part employed in the present invention.
Figure 6:
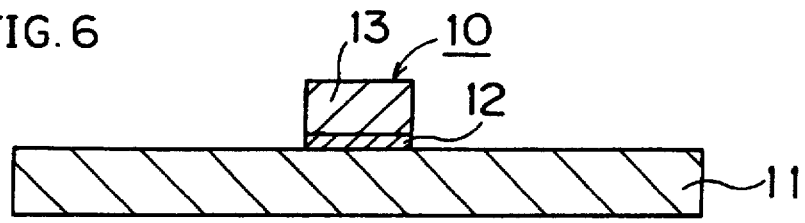
FIG. 6 is a sectional view showing still another exemplary structure of the magnetoresistive element part employed in the present invention.

While the paramagnetic film 12 and the antiferromagnetic film 13 are formed on the overall surface of the magnetoresistive film 11 for forming the magnetoresistive element part 10 as shown in FIG. 4 in each of the aforementioned embodiments, the present invention is not restricted to this structure but paramagnetic films 12 and antiferromagnetic films 13 may be formed only on portions excluding a track part for forming a magnetoresistive element part 10 as shown in FIG. 5, for example. Alternatively, a paramagnetic film 12 and an antiferromagnetic film 13 may be stacked only on a track part for forming a magnetoresistive element part 10, as shown in FIG. 6.

Figure 9:
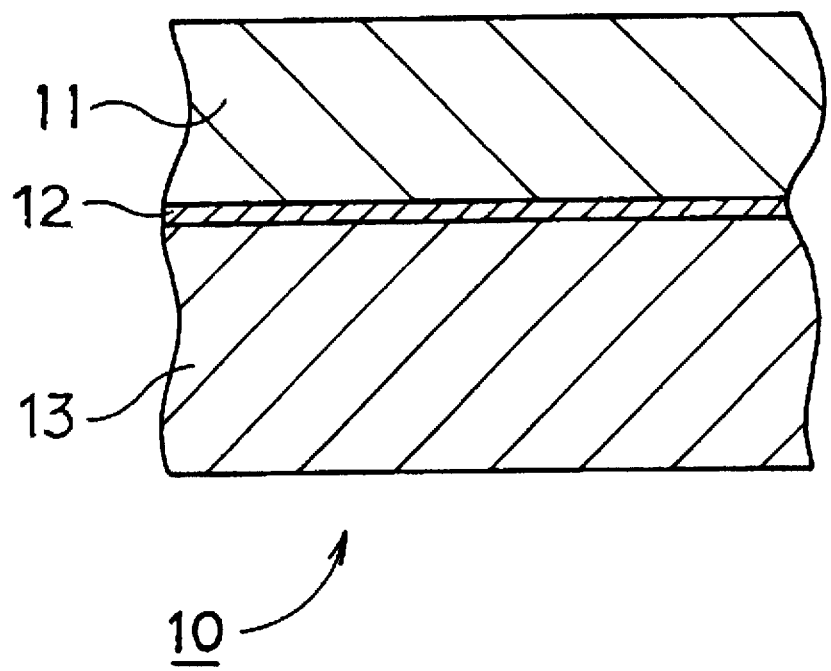
FIG. 9 is a sectional view showing a further exemplary structure of the magnetoresistive element part employed in the present invention.

FIG. 9 is a sectional view showing a further structure of a magnetoresistive element part 10 employed in the present invention. Referring to FIG. 9, this magnetoresistive element part 10 is formed by stacking a magnetoresistive film 11 on an antiferromagnetic film 13 through a paramagnetic film 12. According to this structure, the magnetoresistive film 11 is prepared from an NiFe alloy in a thickness of 250 Å and the antiferromagnetic film 13 is prepared from NiO in a thickness of 300 Å, while the paramagnetic film 12 is prepared from an NiCu alloy in a thickness of 50 Å.

A sample of this structure exhibited an exchange coupling magnetic field of 2.0 Oe.

Further, a magnetic head formed by the multilayer film of this structure exhibited excellent characteristics with no Barkhausen noise, similarly to the characteristics shown in FIG. 7.

When thicknesses of NiCu films were varied in the range of 10 to 80 Å in samples of this structure, exchange coupling magnetic fields were varied in the range of 9 to 1 Oe. Thus, it has been recognized possible to control exchange coupling by controlling the thickness of the paramagnetic film 12.

Figure 10:
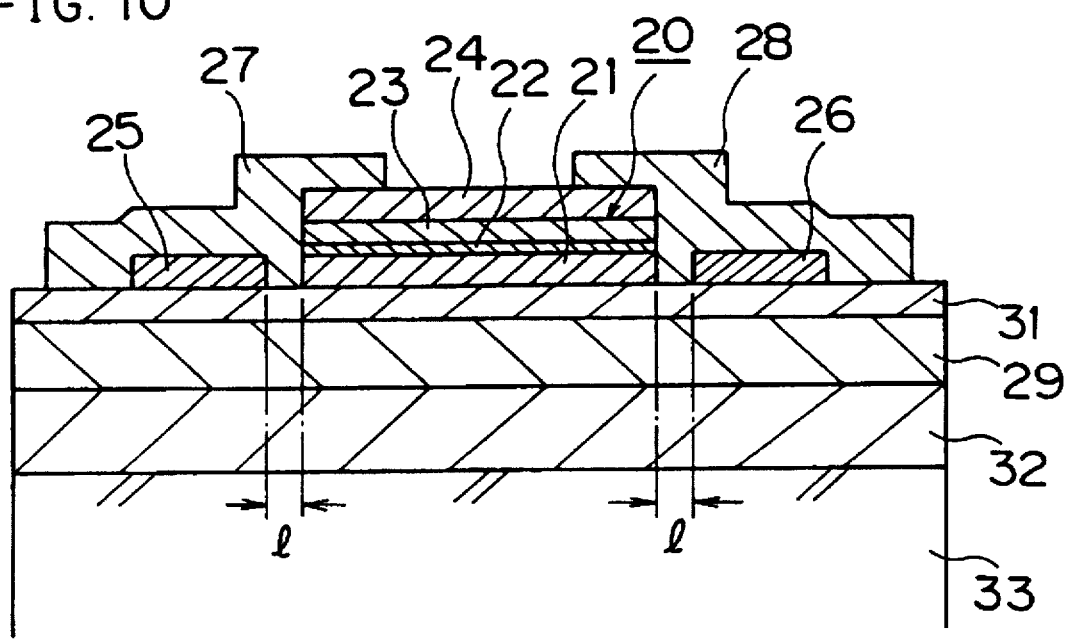
FIG. 10 is a sectional view showing a magnetoresistive head according to a third embodiment of the present invention.

When the antiferromagnetic film 13 was prepared from CRAl in place of NiO in a thickness of 300 Å, results similar to the above were attained. FIG. 10 is a sectional view showing a magnetoresistive head according to a third embodiment of the present invention, which is provided with second magnetic domain control layers. Referring to FIG. 10, an insulating layer 32, a lower shielding layer 29 and another insulating layer 31 are successively formed on a substrate 33 consisting of ceramics. A magnetoresistive element part 20 is formed by a magnetoresistive film 21 consisting of NiFe, a paramagnetic film 22 consisting of NiCu, and an antiferromagnetic film 23 consisting of γ-FeMn. This magnetoresistive element part 20 is substantially similar to the magnetoresistive element part 10 shown in FIG. 1. The magnetoresistive film 21 has an anisotropy magnetic field of 6 Oe.

A shunt layer 24 consisting of Mo is formed on the magnetoresistive element part 20. Second magnetic domain control layers 25 and 26 are formed on portions of the insulating layer 31 which are separated from side surfaces of the magnetoresistive film 21 by distances l. The second magnetic domain control layers 25 and 26 can be formed by soft magnetic films having high anisotropy magnetic field and high saturation magnetic flux density, such as those of a CoZr amorphous alloy, for example. According to this embodiment, the second magnetic domain control layers 25 and 26 are formed by thin films consisting of a CoZrSn amorphous alloy. The second magnetic domain control layers 25 and 26 have anisotropy magnetic fields of 17 Oe, which are larger than that of the magnetoresistive film 21. Further, the second magnetic domain control layers 25 and 26 have extremely small MR ratios of not more than 0.1%.

A pair of electrode layers 27 and 28 are formed on both sides of the shunt layer 24. These electrode layers 27 and 28 are formed to cover the second magnetic domain control layers 25 and 26 respectively. A portion located between the electrode layers 27 and 28 defines a track part.

Figure 11:
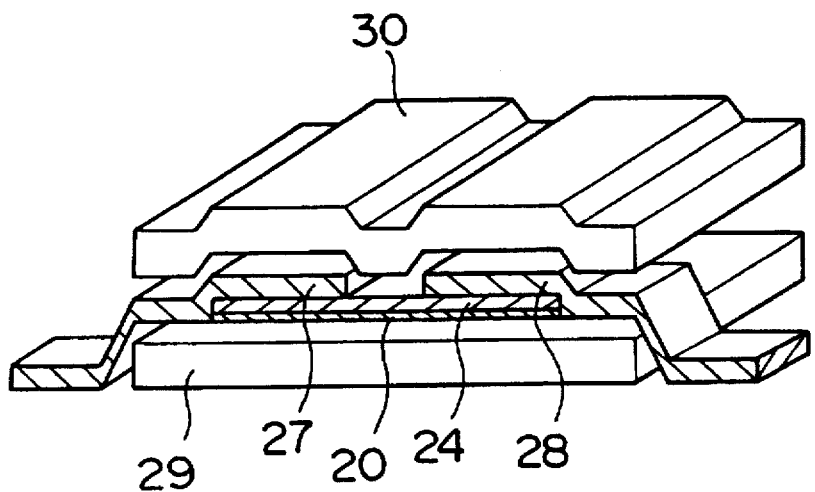
FIG. 11 is a perspective view of the magnetoresistive head according to the third embodiment shown in FIG. 10.

FIG. 11 is a perspective view showing the magnetoresistive head according to the embodiment shown in FIG. 10. As shown in FIG. 11, an upper shielding layer 30 is provided above the electrode layers 27 and 28. Referring to FIG. 11, the second magnetic control layers 25 and 26 as well as the insulating layer 31 provided on the lower shielding layer 29 are omitted.

Figure 12:
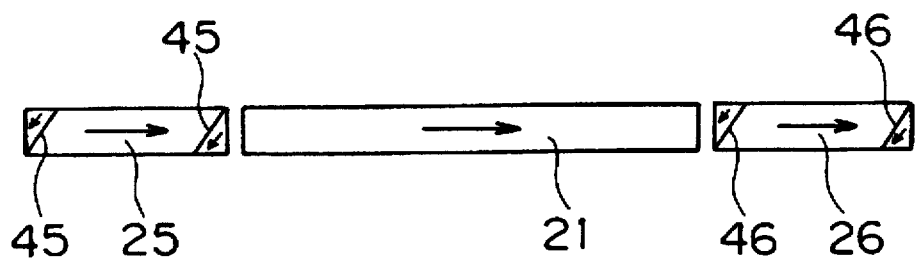
FIG. 12 is a plan view showing a magnetic domain structure of a magnetoresistive film in the embodiment shown in FIG. 10.

FIG. 12 is a plan view showing a magnetic domain structure of the magnetoresistive film 21 provided in the embodiment shown in FIG. 10 examined by a Bitter method using colloid. As shown in FIG. 12, the magnetoresistive film 21 has a single magnetic domain structure, with formation of no magnetic domain wall. On the other hand, magnetic domain walls 45 and 46 are respectively formed in the second magnetic domain control layers 25 and 26, which are made of a material having high magnetic domain energy. In reproduction, the magnetic domain walls 45 and 46 formed in the second magnetic domain control layer 25 and 26 are moved by external magnetic fields, while the magnetoresistive film 21, which is not in contact with the second magnetic domain control layers 25 and 26, are not influenced by such movement of the magnetic domain walls 45 and 46. Thus, no Barkhausen noise is caused.

Figure 13:
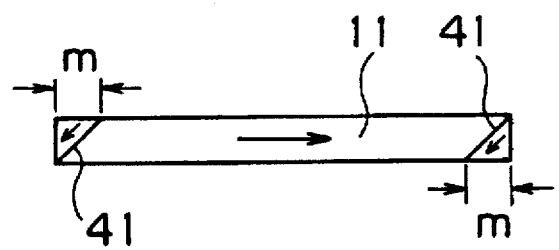
FIG. 13 is a plan view showing a magnetic domain structure of a comparative magnetoresistive film.

FIG. 13 is a plan view showing a magnetic domain structure of a magnetoresistive film 11 which is provided with no second magnetic domain control layers. In this case, magnetic domain walls 41 are formed in the magnetoresistive film 11, to easily cause a closure domain. It is conceivable that Barkhausen noise is easily caused by such magnetic domain walls 41, which are moved by influence exerted from external magnetic fields in reproduction.

As hereinabove described, it is possible to further suppress occurrence of Barkhausen noise by providing second magnetic domain control layers.

Figure 14:
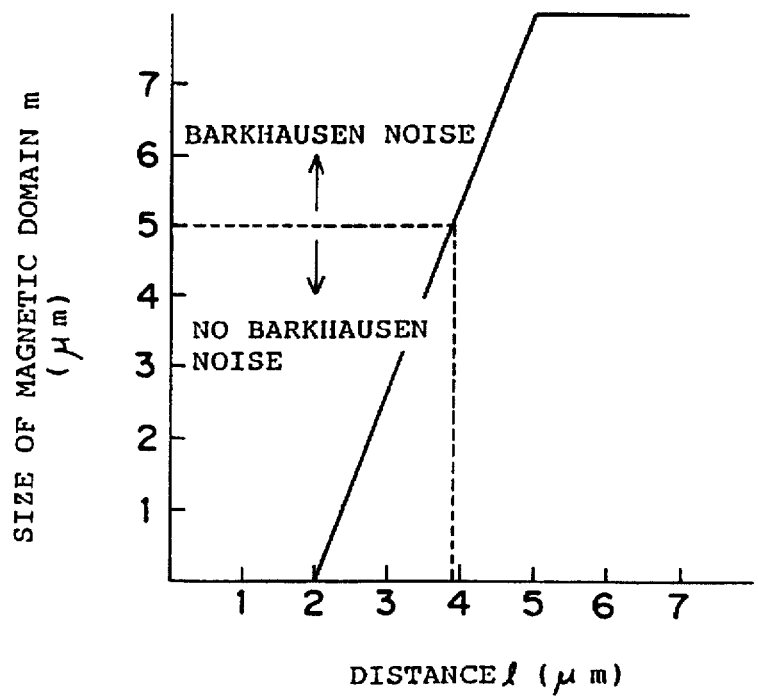
FIG. 14 illustrates a relation of a distance between a magnetoresistive film and each second magnetic domain control layer to the value of a magnetic domain.

FIG. 14 shows a relation of the distance l between the magnetoresistive film 21 and the second magnetic domain control layer 25 or 26 to occurrence of Barkhausen noise. Referring to FIG. 14, the axis of ordinates shows a size of magnetic domain formed on each end of the magnetoresistive film 21, i.e., m appearing in FIG. 13.

As shown in FIG. 14, the magnetoresistive film 21 has a single magnetic domain structure with formation of no magnetic domain, when the distance l between the same and each second magnetic domain control layer is not more than 2 μm. When the distance l is not more than 4 μm, a size of magnetic domain m of not more than 5 μm is formed with no occurrence of Barkhausen noise.

Figure 15:
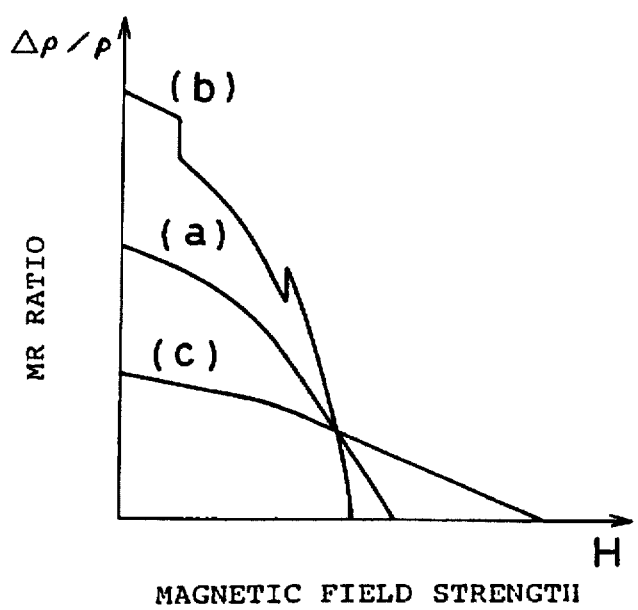
FIG. 15 illustrates relations between magnetic field strength values and MR ratios in magnetoresistive heads.

FIG. 15 shows relations between magnetic field strength values (transverse biases) and MR ratios in samples related to the magnetoresistive head according to the embodiment shown in FIG. 10. Referring to FIG. 15, a curve (a) shows the relation between the magnetic field strength and the MR ratio of the magnetoresistive head shown in FIG. 10, a curve (b) shows that of a magnetoresistive head which is formed by a magnetoresistive element part without first and second magnetic domain control layers, and a curve (c) shows that of a magnetoresistive head having a magnetoresistive film provided with an antiferromagnetic film as described in Japanese Patent Publication No. 60-32330 (1985). In the comparative magnetoresistive head (c), an exchange coupling magnetic field formed by the antiferromagnetic film is a longitudinal bias of at least 20 Oe.

As shown in FIG. 15, the comparative magnetoresistive head (b) causing Barkhausen noise is improper in practicalization, although the same is excellent in magnetic response with a high MR ratio. On the other hand, the comparative magnetoresistive head (c) is inferior in magnetic response with a small MR ratio, although the same can be put into practice with no occurrence of Barkhausen noise. In this head (c), further, the optimum transverse bias magnetic field is increased to reduce efficiency. On the other hand, the magnetoresistive head (a) according to this embodiment has a high MR ratio with no Barkhausen noise, and is excellent in magnetic response. Further, this magnetoresistive head (a) is also excellent in efficiency with a small optimum transverse bias, due to a small exchange coupling magnetic field between the magnetoresistive film and the antiferromagnetic film.

Figure 16:
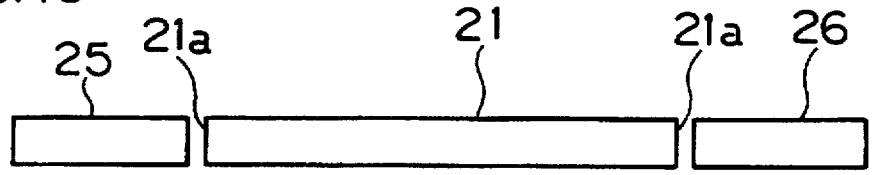
FIG. 16 is a plan view showing exemplary shapes of a magnetoresistive film and second magnetic domain control layers.

FIG. 16 is a plan view showing exemplary structures of a magnetoresistive film 21 and second magnetic domain control layers 25 and 26 according to the present invention. The second magnetic domain control layers 25 and 26 shown in FIG. 16 are substantially equal in width to the magnetoresistive film 21. Thus, side surfaces of the second magnetic domain control layers 25 and 26 are opposed to overall side surfaces 21a of the magnetoresistive film 21.

Figure 17:
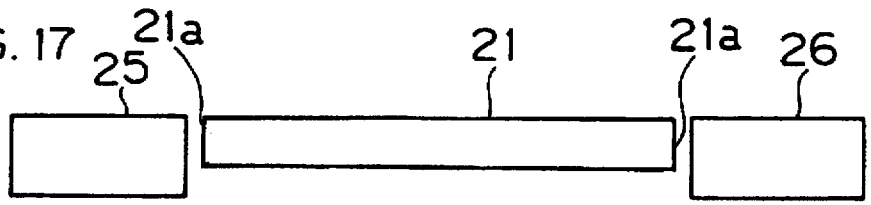
FIG. 17 is a plan view showing other exemplary shapes of a magnetoresistive film and second magnetic domain control layers.

FIG. 17 shows other exemplary structures of a magnetoresistive film 21 and second magnetic domain control layers 25 and 26. Referring to FIG. 17, the second magnetic domain control layers 25 and 26 having larger width extend beyond the magnetoresistive film 21. It is also possible to attain effects by the second magnetic domain control layers 25 and 26 through such structures.

Figure 18:
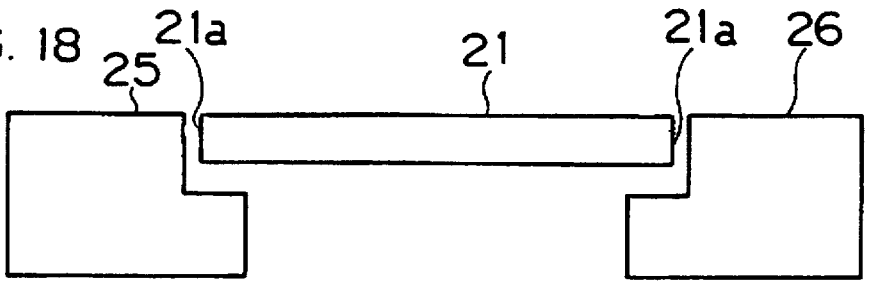
FIG. 18 is a plan view showing further exemplary shapes of a magnetoresistive film and second magnetic domain control layers.

FIG. 18 is a plan view showing further exemplary structures of a magnetoresistive film 21 and second magnetic domain control layers 25 and 26. Referring to FIG. 18, the second magnetic domain control layers 25 and 26 have larger width than the magnetoresistive film 21, while the second magnetic domain control layers 25 and 26 project toward each other under the magnetoresistive film 21. It is also possible to attain effects by the second magnetic domain control layers 25 and 26 through such structures, similarly to the structures shown in FIGS. 16 and 17.

Figure 19:
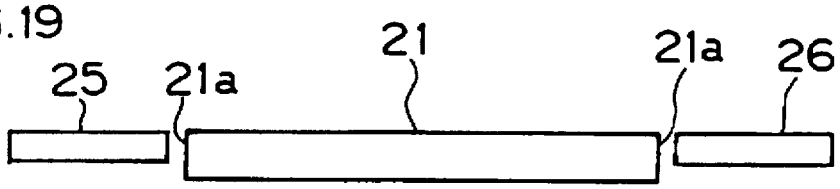
FIG. 19 is a plan view showing shapes of second magnetic domain control layers having smaller side surfaces than overall side surfaces of a magnetoresistive film.

FIG. 19 shows such structures that second magnetic domain control layers 25 and 26 are smaller in width than a magnetoresistive film 21. When side surfaces of the second magnetic domain control layers 25 and 26 are smaller than overall side surfaces 21a of the magnetoresistive film 21 which are opposed thereto, there is a tendency that effects of the second magnetic domain control layers 25 and 26 cannot be attained.

Figure 20:
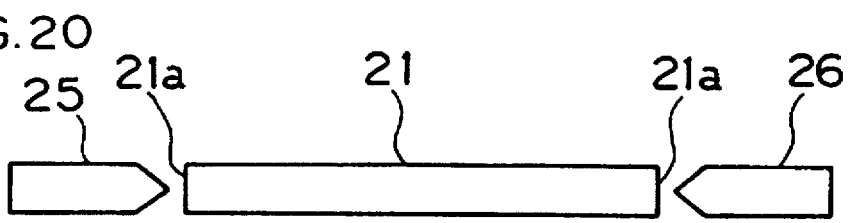
FIG. 20 is a plan view showing shapes of second magnetic domain control layers having acute-angled portions facing side surfaces of a magnetoresistive film.

FIG. 20 shows such structures that second magnetic domain control layers 25 and 26 have acute-angled side surfaces. Also in this case, there is a tendency that effects of the second magnetic domain control layers 25 and 26 cannot be attained.

As clearly understood from the above, the side surfaces of the second magnetic domain control layers are preferably opposed to the overall side surfaces of the magnetoresistive film.

While each of the aforementioned embodiments has been described with reference to a shunt bias system magnetoresistive head, the present invention is not restricted to this but is also applicable to a soft bias system magnetoresistive head, for example.

It is clarified here that the present invention is not restricted to the structures of the aforementioned embodiments and the materials described above.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A magnetoresistive head comprising:
    a magnetoresistive element including
        a) a magnetoresistive film for converting a magnetic signal to an electric signal by a magnetoresistive effect, and
        b) a first magnetic domain control layer being provided in contact with said magnetoresistive film;
    transverse biasing means for transverse biasing said magnetoresistive film; and
    a pair of electrodes, provided on said magnetoresistive element, for feeding a signal detection current to said magnetoresistive film,
    said first magnetic domain control layer including a) a paramagnetic film provided on 2nd in contact with said magnetoresistive film, and b) an antiferromagnetic film provided on 2nd in contact with said paramagnetic film.

2. A magnetoresistive head in accordance with claim 1, wherein said magnetoresistive film, said first magnetic domain control layer and said pair of electrodes are provided between a pair of shielding layers.

3. A magnetoresistive head in accordance with claim 1, wherein all of said magnetoresistive film, said antiferromagnetic film and said paramagnetic film have face centered cubic structures.

4. A magnetoresistive head in accordance with claim 1, wherein said antiferromagnetic film is made of an FeMn alloy, a CRAl alloy, an NiMn alloy, or NiO.

5. A magnetoresistive head in accordance with claim 1, wherein said paramagnetic film is made of an NiCu alloy.

6. A magnetoresistive head in accordance with claim 1, wherein said paramagnetic film is made of an NiCu alloy having a Curie point of not more than 20° C.

7. A magnetoresistive head in accordance with claim 1, wherein said magnetoresistive film is made of an NiFe alloy.

8. A magnetoresistive head in accordance with claim 1, wherein said magnetoresistive film is formed on an underlayer.

9. A magnetoresistive head in accordance with claim 8, wherein said underlayer is made of Ta, Nb, Mo, Ti or $Si_3N_4$.

10. A magnetoresistive head in accordance with claim 1, further comprising a second magnetic domain control layer provided in a position separated from a side surface of said magnetoresistive film in a direction parallel to a surface of a substrate.

11. A magnetoresistive head in accordance with claim 10, wherein said second magnetic domain control layer is made of a material having a larger anisotropy magnetic field than said magnetoresistive film.

12. A magnetoresistive head in accordance with claim 10, wherein said second magnetic domain control layer is formed by a soft magnetic film.

13. A magnetoresistive head in accordance with claim 10, wherein said second magnetic domain control layer is made of a CoZr amorphous alloy.

14. A magnetoresistive head in accordance with claim 10, wherein the distance between said magnetoresistive film and said second magnetic domain control layer is not more than 4 μm.

15. A magnetoresistive head in accordance with claim 10, wherein said second magnetic domain control layer is so provided that its side surface is opposed to overall said side surface of said magnetoresistive film.

16. A magnetoresistive head according to claim 1, wherein a thickness of said paramagnetic film is in a range of 5 to 80 Å.

17. A magnetoresistive head comprising:
    a magnetoresistive element including
        a) a magnetoresistive film for converting a magnetic signal to an electric signal by a magnetoresistive effect, and
        b) a first magnetic domain control layer being provided in contact with said magnetoresistive film;
    a transverse bias means for transverse biasing the magnetoresistive film; and
    a pair of electrodes, provided on said magnetoresistive element, for feeding a signal detection current to said magnetoresistive film,
    said first magnetic domain control layer including a) a paramagnetic film provided on and in contact with said magnetoresistive film, and b) an antiferromagnetic film provided on and in contact with said paramagnetic film, and said paramagnetic film being provided for reducing exchange coupling between said antiferromagnetic film and said magnetoresistive film.

* * * * *

UNITED STATES PATENT AND TRADEMARK OFFICE
CERTIFICATE OF CORRECTION

PATENT NO. : 5,699,213

DATED : December 16, 1997

INVENTOR(S) : Ohyama et al.

It is certified that error appears in the above-identified patent and that said Letters Patent is hereby corrected as shown below:

```
    Claim 1, Column 9, lines 58 and 60, please delete "2nd" and
insert therefor -- and --.
```

Signed and Sealed this

Thirty-first Day of March, 1998

*Attest:*

BRUCE LEHMAN

*Attesting Officer*    *Commissioner of Patents and Trademarks*